United States Patent
Oden et al.

(10) Patent No.: US 11,434,130 B2
(45) Date of Patent: Sep. 6, 2022

(54) SURFACE MICROMACHINED STRUCTURES

(71) Applicant: Texas Instruments Incorporated, Dallas, TX (US)

(72) Inventors: Patrick Ian Oden, McKinney, TX (US); James Norman Hall, Parker, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/731,997

(22) Filed: Dec. 31, 2019

(65) Prior Publication Data
US 2021/0198103 A1 Jul. 1, 2021

(51) Int. Cl.
| | |
|---|---|
| *B81C 1/00* | (2006.01) |
| *G03B 21/00* | (2006.01) |
| *B81B 3/00* | (2006.01) |
| *H04N 13/365* | (2018.01) |
| *H04N 5/74* | (2006.01) |

(52) U.S. Cl.
CPC ........ *B81C 1/00492* (2013.01); *B81B 3/0018* (2013.01); *B81C 1/00404* (2013.01); *G03B 21/008* (2013.01); *B81B 2201/042* (2013.01); *H04N 5/7458* (2013.01); *H04N 13/365* (2018.05); *Y10S 359/904* (2013.01)

(58) Field of Classification Search
CPC ............ B81C 1/00492; B81C 1/00404; B81C 2201/0132; B81C 2201/0157; B81C 2201/0142; B81B 3/0018; B81B 2201/042; B81B 3/0083; G03B 21/008; Y10S 359/904; H04N 13/365; H04N 5/7458
See application file for complete search history.

(56) References Cited

U.S. PATENT DOCUMENTS

| | | | | |
|---|---|---|---|---|
| 5,867,302 | A * | 2/1999 | Fleming | H01G 5/16 359/224.1 |
| 6,236,491 | B1 * | 5/2001 | Goodwin-Johansson | B81C 1/00666 359/291 |
| 6,275,325 | B1 * | 8/2001 | Sinclair | B81B 3/0024 359/290 |
| 6,456,420 | B1 * | 9/2002 | Goodwin-Johansson | B81B 3/0018 333/246 |
| 6,862,127 | B1 | 3/2005 | Ishii | |
| 2003/0071330 | A1 * | 4/2003 | Romano | H05K 3/4092 257/669 |
| 2009/0021884 | A1 * | 1/2009 | Nakamura | B81B 3/0059 359/224.1 |

(Continued)

FOREIGN PATENT DOCUMENTS

DE  1020151177556 A1  4/2017

OTHER PUBLICATIONS

Search Report for PCT Patent Application No. PCT/US2020/067107, date of mailing of the international search report dated Mar. 18, 2021, 1 page.

*Primary Examiner* — Yasser A Abdelaziez
(74) *Attorney, Agent, or Firm* — Charles A. Brill; Frank D. Cimino

(57) ABSTRACT

Described examples include an apparatus having a substrate with a substrate surface. The apparatus also includes an element with a planar surface facing the substrate surface and with a nonplanar surface opposite the planar surface facing away from the substrate surface.

29 Claims, 16 Drawing Sheets

(56) References Cited

U.S. PATENT DOCUMENTS

| | | | | |
|---|---|---|---|---|
| 2012/0194890 A1* | 8/2012 | Park | ................. | H04N 1/113 |
| | | | | 359/199.1 |
| 2014/0226194 A1* | 8/2014 | Mihara | ................. | G02B 26/105 |
| | | | | 359/198.1 |
| 2014/0340726 A1* | 11/2014 | Gu-Stoppel | ......... | G02B 26/0833 |
| | | | | 359/224.1 |
| 2019/0345023 A1* | 11/2019 | Duerr | ................. | G02B 26/0833 |

* cited by examiner

SURFACE MICROMACHINED STRUCTURES

TECHNICAL FIELD

This relates generally to micro-mechanical device fabrication, and, in particular examples, to micromirror devices and their fabrication.

BACKGROUND

Digital micromirror devices (DMDs) are sometimes used as spatial light modulators.

A mirror reflects light from a light source either toward or away from a target in response to a signal provided to the mirror. An array of micromirrors can be used to project an image onto the target, where an individual micromirror modulates the light of one pixel of the image. A high-quality image can be produced using sophisticated timing techniques and multicolor light sources. However, there is a continuing demand for ever higher image resolution. For a given manufacturing technology, the number of micromirrors (pixels) on a DMD is limited.

SUMMARY

In accordance with an example, an apparatus has a substrate with a substrate surface. The apparatus includes an element with a planar surface facing the substrate surface and with a nonplanar surface opposite the planar surface facing away from the substrate surface.

DETAILED DESCRIPTION

Figure 1:
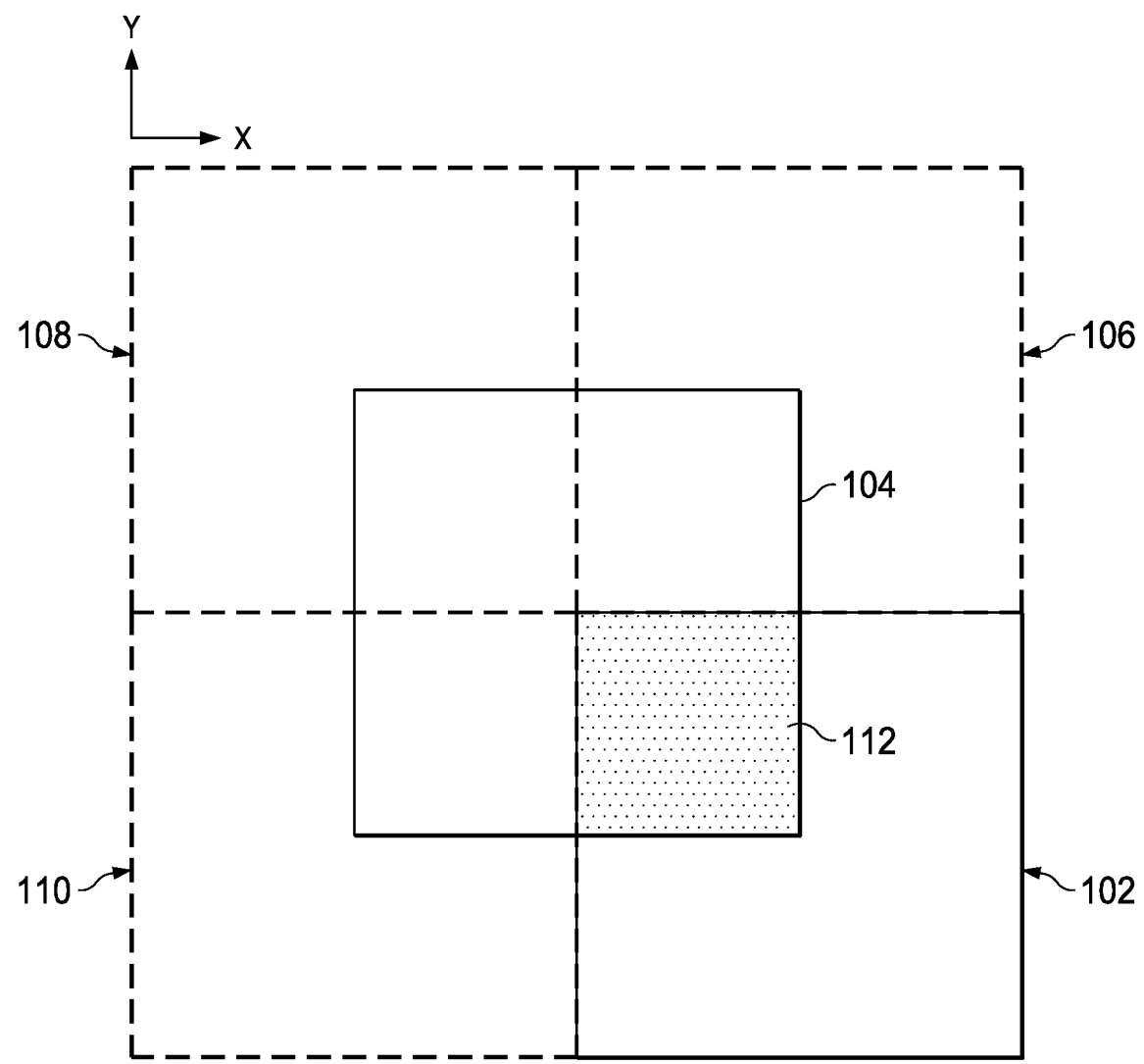
FIG. 1 is a diagram showing the relative pixel position of two pixels in an extended pixel resolution (XPR) system.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Elements referred to herein as "optically coupled" are elements that include a connection between the elements that involves transmission of light. Also, as used herein, the terms "on" and "over" may include layers or other elements where intervening or additional elements are between an element and the element that it is "on" or "over." In addition, as used herein, the term "planar" means that a surface is intended to be planar or is planar within acceptable tolerances in the context of the "planar" surface. Also, as used herein, the term "via" means a conductive connection between two elements through a "via opening." As used herein, "grayscale" means a range of gray shades up to and including white and black. A "grayscale mask" is a mask having a grayscale so that the image produced by illuminating the mask has differing light intensity.

In example arrangements, the problem of providing micro-mechanical elements having a desired profile on one surface of the micro-mechanical element without changing the profile of other surfaces of the micro-mechanical element is solved by exposing a photoresist layer on a surface of the micro-mechanical element to a laterally varying light intensity corresponding to the desired profile; developing the photoresist to have the desired profile; and anisotropically etching the photoresist and the surface of the micro-mechanical element to transfer the desired pattern to the surface of the micro-mechanical element. In an example arrangement, an apparatus has a substrate with a substrate surface. The apparatus includes an element with a planar surface facing the substrate surface and with a nonplanar surface opposite the planar surface facing away from the substrate surface.

To improve image resolution using a DMD with a given number of pixels, example arrangements use techniques such as extended pixel resolution (XPR). With XPR, each pixel of the DMD serves double duty. That is, an XPR device projects a first image on the target. The device then shifts the pixel alignment of the image and projects a second image. In many cases, the shift is one-half pixel in each of the orthogonal x and y directions. This shift places the pixels of the second image at the corners of the pixels in the first image. The second image projected is additional pixels of the first image. The viewer's eyes integrate the first and second images into one image with double the resolution of the DMD. However, because the pixels of the first and second images overlap, an XPR image may have lower contrast than a non-XPR image because the edges of objects in the image may be slightly blurred.

FIG. 1 is a diagram showing the relative pixel position of two pixels in an extended pixel resolution (XPR) system at a projection target (not shown), one unshifted pixel 102 and one shifted pixel 104. Both pixel 102 and pixel 104 are produced by the same pixel in a spatial light modulator (not shown), such as a digital micromirror device (DMD). Pixel 102 shifts to pixel 104 using one of several techniques. For example, a movable plate (not shown) in the optical path of a projector (not shown). In this example, pixel 104 shifts one-half pixel in the positive y direction and one-half pixel in the negative x direction. Other examples may shift in different directions relative to the x/y axis as shown in FIG. 1. The center of pixel 104 is approximately at a corner of pixel 102. Pixels 106, 108 and 110 are pixels that are adjacent to pixel 102. The center of pixel 104 is at the corner of pixels 102, 106, 108 and 110 and equidistant from the center of those pixels. By alternating different modulations of pixel 102 and pixel 104 several times in a frame display period, the viewer's eye integrates the two modulations and the image appears to have twice as many pixels. However, in this example, the overlap 112 between pixel 102 and pixel 104 is one quarter of a pixel. In addition, the other three quarters of each pixel overlaps adjacent pixels. This overlap can cause blurred edges of displayed elements and other contrast issues.

Figure 2:
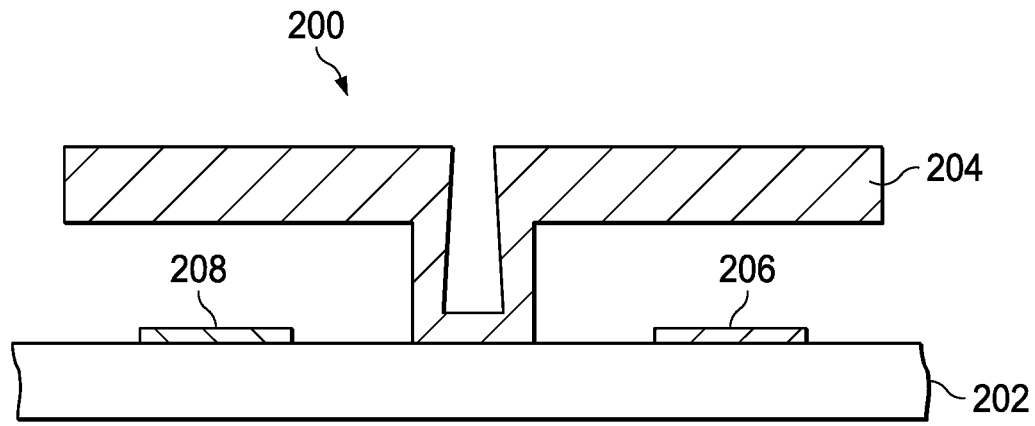
FIG. 2 is a diagram of an example micromirror.
Figure 3:
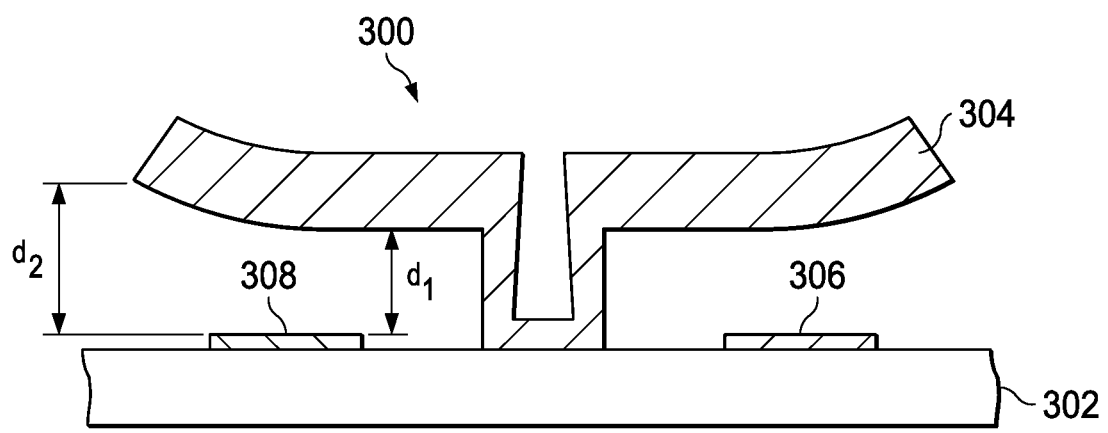
FIG. 3 is a diagram of another example micromirror.

FIG. 2 is a diagram of an example micromirror 200. Micromirror 200 includes mirror 204 on substrate 202. Mirror 204 tilts one direction or the other by electrostatic force of a potential applied between mirror 204 and either electrode 206 or electrode 208. FIG. 3 is a diagram of another example micromirror 300. Micromirror 300 includes mirror 304 on substrate 302. Mirror 304 tilts one direction or the other direction by electrostatic force of a potential applied between mirror 304 and either electrode 306 or electrode 308. In contrast to mirror 204, mirror 304 is intentionally warped to provide a concave upper surface.

Figure 4:
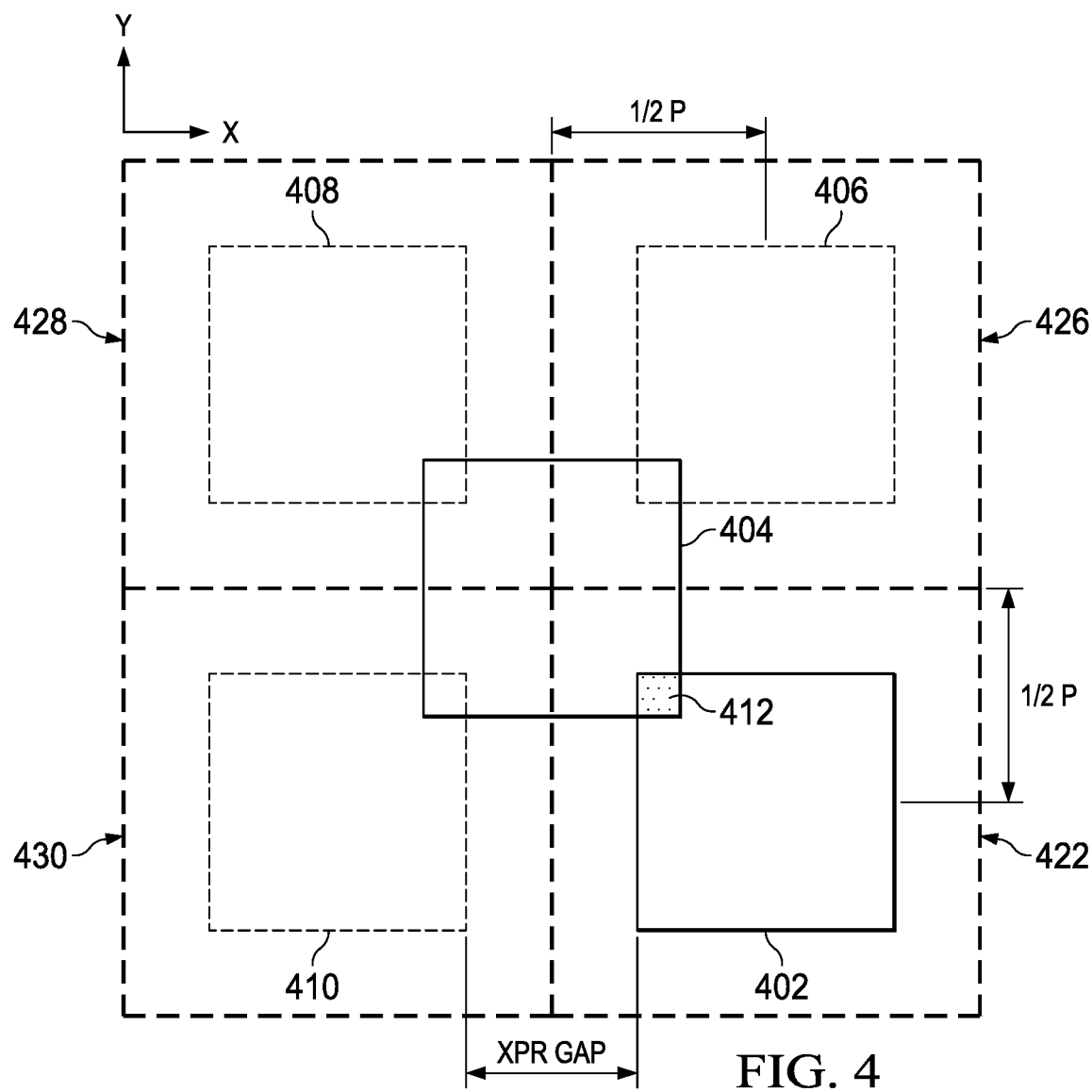
FIG. 4 is diagram showing the pixel position in an XPR system using the micromirror of FIG. 3.

FIG. 4 is diagram showing the pixel position in an XPR system using micromirror 300 (FIG. 3). Because micromirror 300 (FIG. 3) has a concaved upper surface, the size of the projected pixel 402 at the target is smaller. However, because micromirror 300 (FIG. 3) covers nearly the entire area of, for example pixel area 422, micromirror 300 (FIG. 3) efficiently transmits modulated light. Projected pixel 404 is a shift of projected pixel 402. Projected pixel 404 has a shift of ½ pixel in the x direction and −½ pixel in the y direction. P is the pixel width corresponding to a flat micromirror. The reduced size of the projected pixel 402 with the pitch between pixels of P creates an XPR Gap. Projected pixel 404 is centered in the XPR Gap between projected pixel 406, projected pixel 408 and projected pixel 410. These projected pixels are centered in pixel position 426, pixel position 428 and pixel position 430, respectively. Because of the XPR Gap, projected pixel 404 has a small overlap 412 with projected pixel 402. Projected pixel 404 has a similarly small overlap with projected pixel 406, projected pixel 408 and projected pixel 410. This small overlap reduces blurred edges of displayed elements and other contrast issues as compared to micromirror 200. However, some operational problems with using micromirror 300 have been encountered. As shown in FIG. 3, the distance between electrode 306 and electrode 308 and mirror 304 is not consistent. That is, at the inner edge of electrode 308, the distance between electrode 308 and mirror 304 is $d_1$. At the outer edge of electrode 308, the distance between electrode 308 and mirror 304 is $d_2$, which is greater than $d_1$. The electrostatic force is the inverse of the distance between the objects subject to the electrical potential. Therefore, this change of distance has a significant effect on the force available to move mirror 304, leading to inconsistencies in mirror actuation. In addition, the curved surface on the bottom of mirror 304 makes it more likely that mirror 304 will contact electrode 308 with a significant amount of surface area, thus increasing the chance of mirror 304 permanently sticking to electrode 308.

Figure 5:
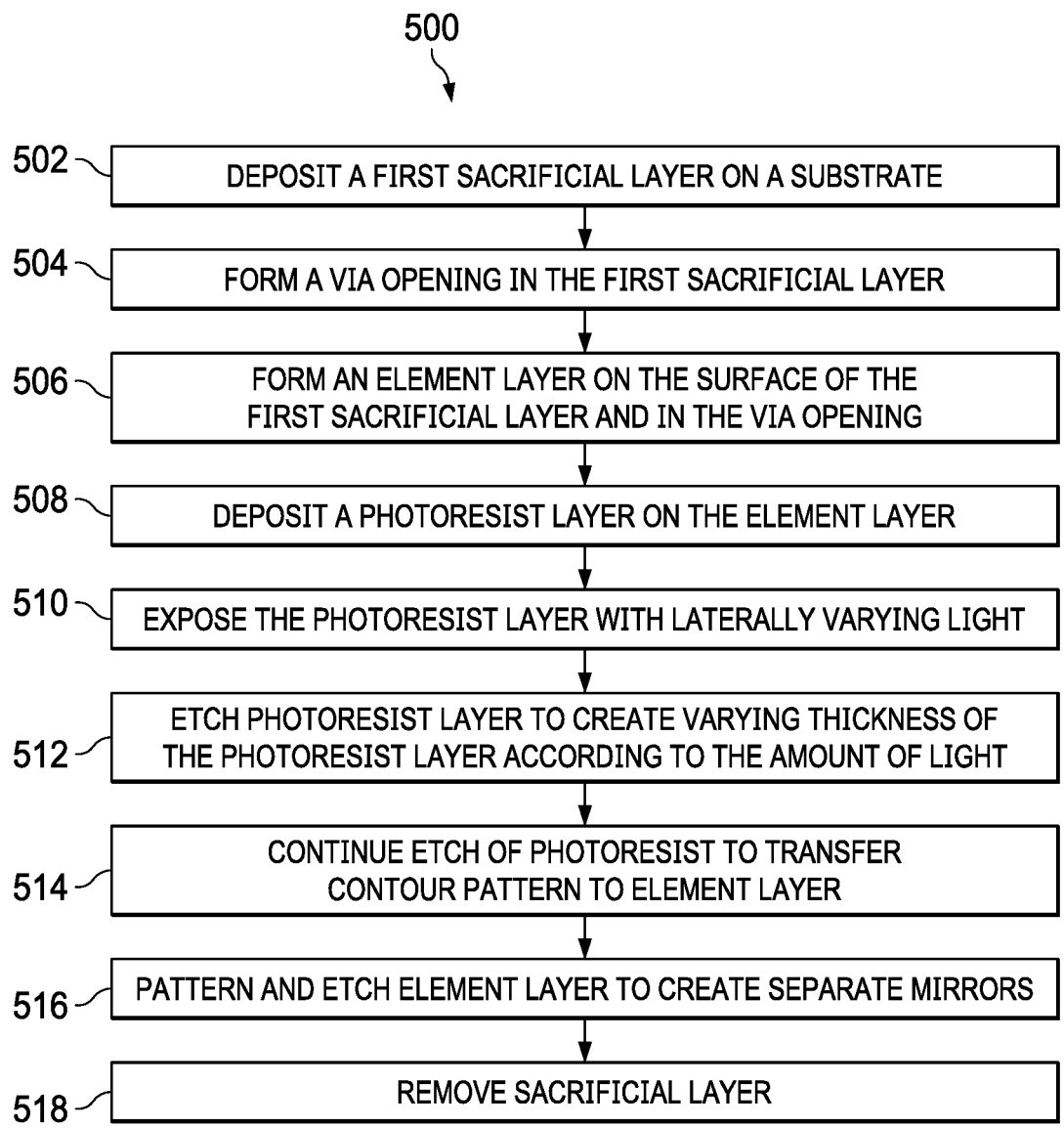
FIG. 5 is a flow diagram of an example process for forming an example apparatus, such as a micromirror.
Figure 6A:
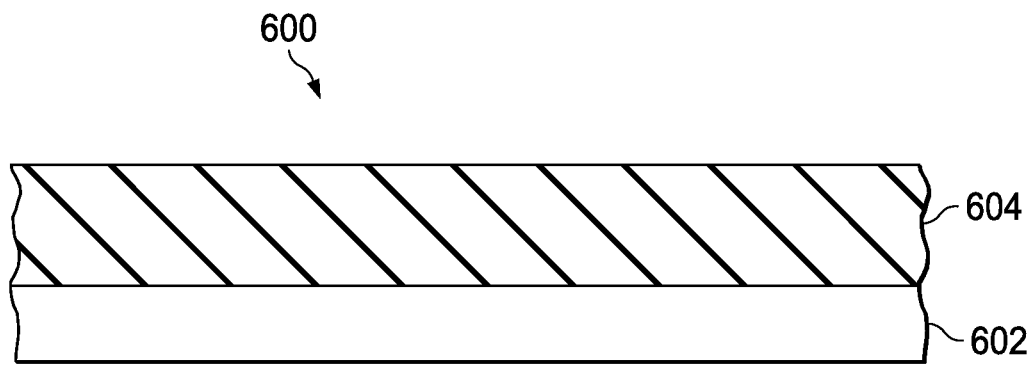
FIGS. 6A-6K (collectively "FIG. 6") are diagrams illustrating the steps of the process of FIG. 5.
Figure 6B:
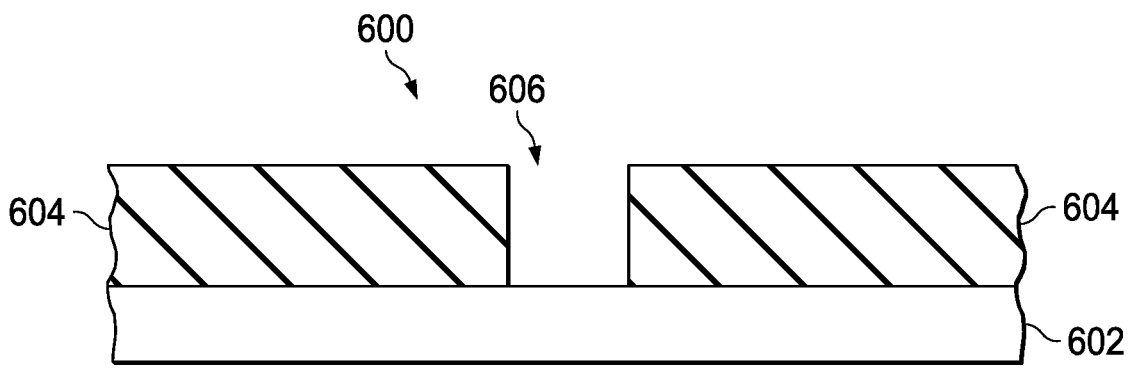

FIG. 5 is a flow diagram of an example process 500 for forming an example apparatus, such as a micromirror. FIGS. 6A-6K (collectively "FIG. 6") illustrate the steps of process 500 and are described concurrently with the description of FIG. 5. Step 502 is depositing a first sacrificial layer on a substrate. As shown in FIG. 6A, sacrificial layer 604 is formed on substrate 602. Examples of materials for sacrificial layer 604 include silicon dioxide, silicon nitride, photoresist, polyimide, germanium, germanium oxide, polycrystalline silicon, phosphor-silicate-glass (PSG), borophospho-silicate glass (BPSG) and spin-on-glass (SOG). The specific method used for forming sacrificial layer 604 is dependent upon the material used. In an example, sacrificial layer 604 is SOG that is spun-on to a thickness of 0.3 to 2.0μ. Step 504 is forming a via opening in sacrificial layer 604. As shown in FIG. 6B, this step opens a via opening 606 by depositing and patterning a photoresist layer (not shown) and then anisotropically etching sacrificial layer 604.

Figure 6C:
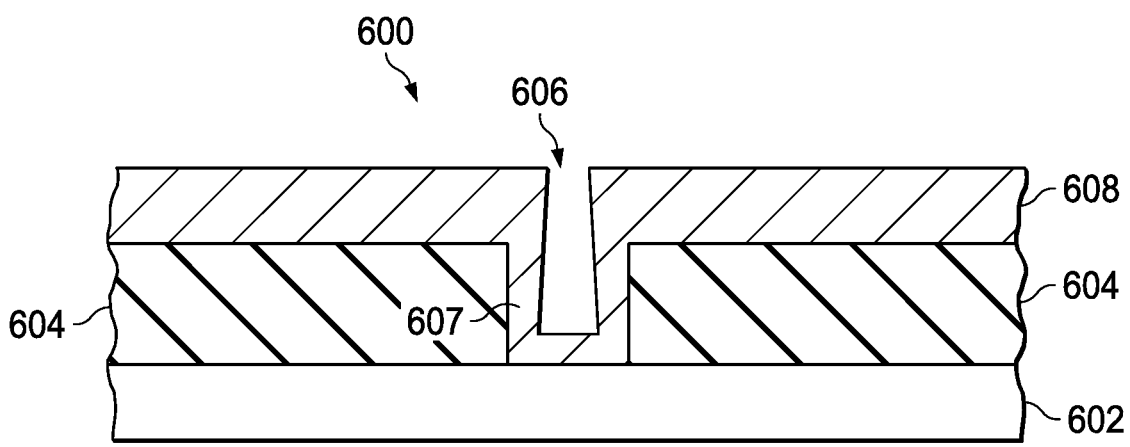
Figure 6D:
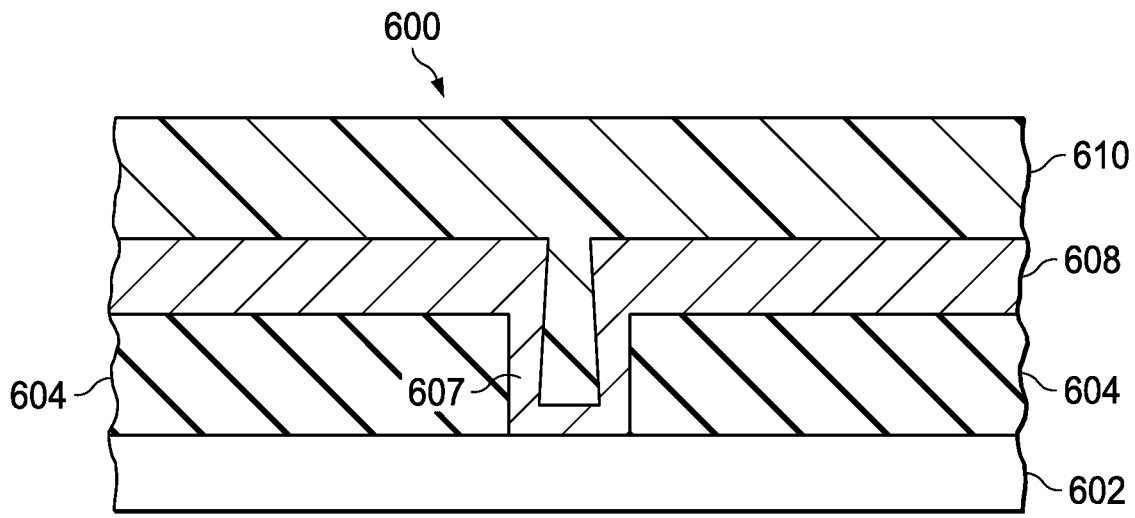

Step 506 is forming an element layer on the surface of the first sacrificial layer and in the via opening. As shown in FIG. 6C, an element layer like mirror layer 608 is formed by depositing a conductive layer to a thickness of 300 to 400 Å on the first sacrificial layer 604 and in via opening 606. Thus, in this example, step 506 forms via 607 from the same material as mirror layer 608. Mirror layer 608 is a layer such as aluminum, titanium-aluminum, titanium or titanium nitride that is deposited by chemical vapor deposition (CVD) or physical vapor deposition (PVD). Circuitry (not shown) in substrate 602 couples to mirror layer 608 at the bottom of via opening 606 to allow for addressing micromirror 600. Step 508 is depositing a photoresist layer on the mirror layer. This step deposits first photoresist layer 610 as shown in FIG. 6D.

Figure 6E:
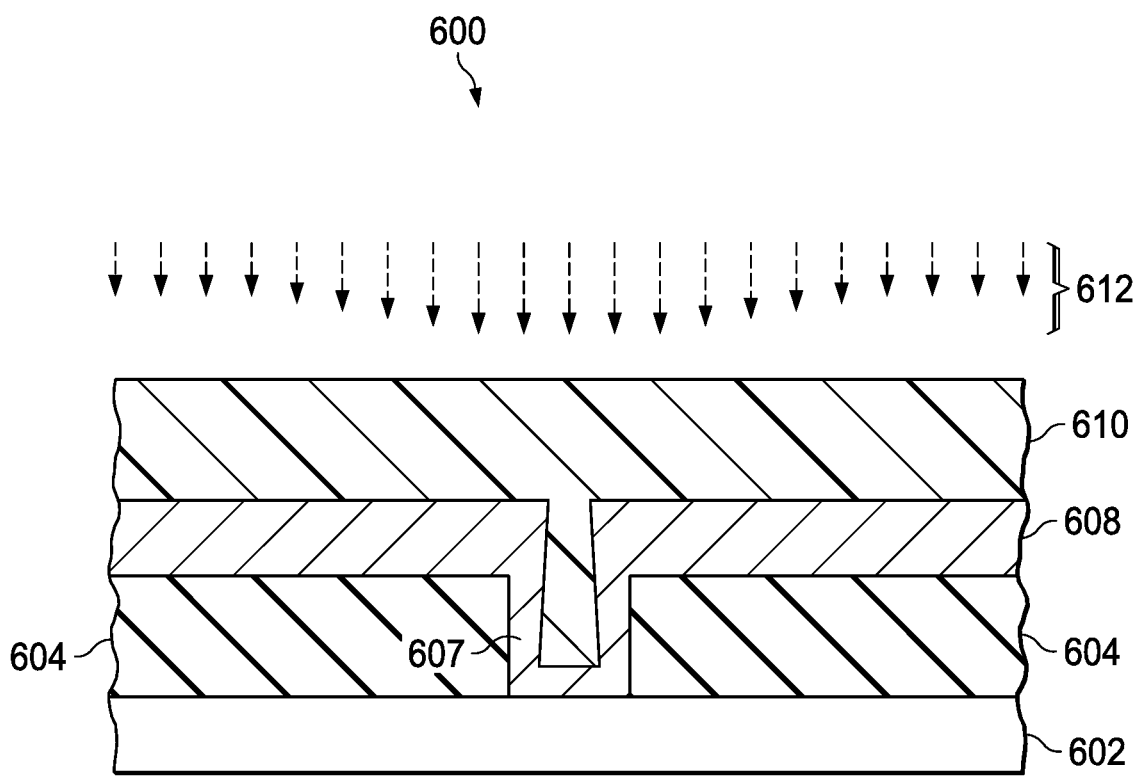
Figure 6F:
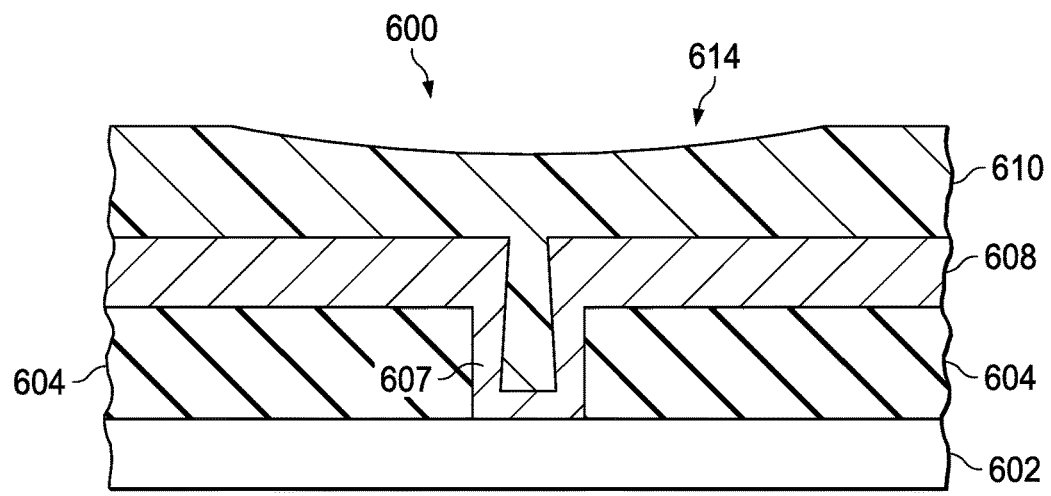

Step 510 is exposing the photoresist layer with laterally varying light. In the example of FIG. 6E, light 612 having a greater intensity above via opening 606 and gradually diminishing intensity at distances from via opening 606 exposes first photoresist layer 610. One term for this varying light is grayscale light. The varying light 612 can be provided by a grayscale mask or by defocusing of a patterned mask, for example. In another example, a projected modulated image may be focused onto first photoresist layer 610. Step 512 is etching (developing) the photoresist layer to create varying thickness of the photoresist layer according to the amount of light to which the photoresist layer is exposed. As shown in FIG. 6F, where greater light strikes first photoresist layer 610, the developer (etchant) for first photoresist layer 610 removes more of first photoresist layer 610. Thus, first photoresist layer 610 has a varying surface contour after step 512. In an example, first photoresist layer 610 is etched anisotropically using a solvent or plasma processing with selective etching to both the sacrificial resist as well as the mirror layer 608, such as chlorine and boron trichloride (Cl/BCl). In this example, this produces an indentation 614 in first photoresist layer 610. In an example, after developing first photoresist layer 610 with indentation 614, a second uniform light fully exposes the remaining part of first photoresist layer 610 to fully polymerize first photoresist layer 610 with indentation 614.

Figure 6G:
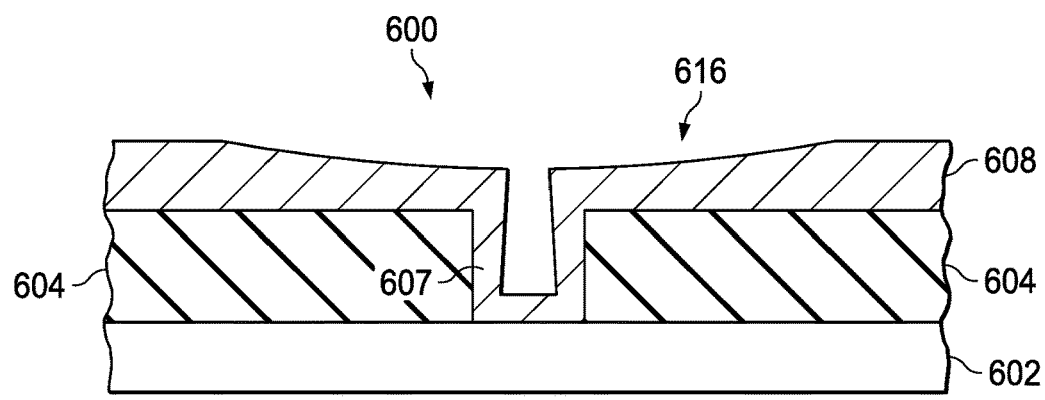

Step 514 is continuing the etch of the photoresist to transfer the contour pattern to the mirror layer. As shown in FIG. 6G, indentation 616 transfers from indentation 614 (FIG. 6F). Thus, the surface of mirror layer 608 with indentation 616 has a nonplanar surface, while the portion of mirror layer 608 on sacrificial layer 604, that is, the surface of mirror layer 608 facing substrate 602 and opposite the nonplanar surface, remains a planar surface. Because of the different natures of first photoresist layer 610 and mirror layer 608, determining an anisotropic etchant with a one to one etching rate for both first photoresist layer 610 and mirror layer 608 is challenging. Some etchants will preferentially etch photoresist and others will preferentially etch metal. This is complicated by the varying behaviors of etching equipment. In an example, a plasma of chlorine and boron trichloride (Cl/BCl). In examples, the contour of first photoresist layer 610 has a different contour than the contour of the resulting mirror layer 608. In this example, the contour of first photoresist layer 610 accounts for the differing etching rates of first photoresist layer 610 and mirror layer 608. That is, the selected contour of first photoresist layer 610 is such that, after the etching of first photoresist layer 610 and mirror layer 608, mirror layer 608 has the desired contour.

Figure 6H:
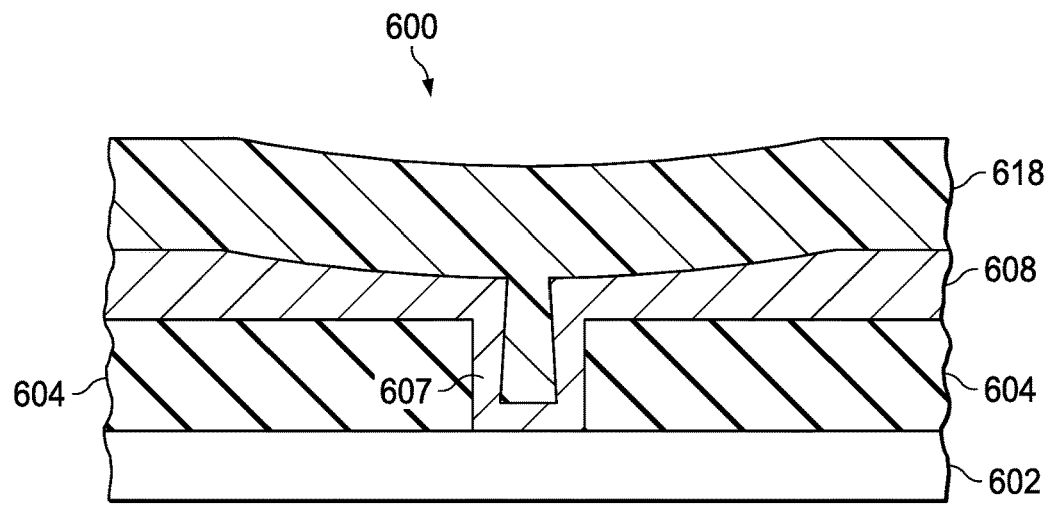
Figure 6I:
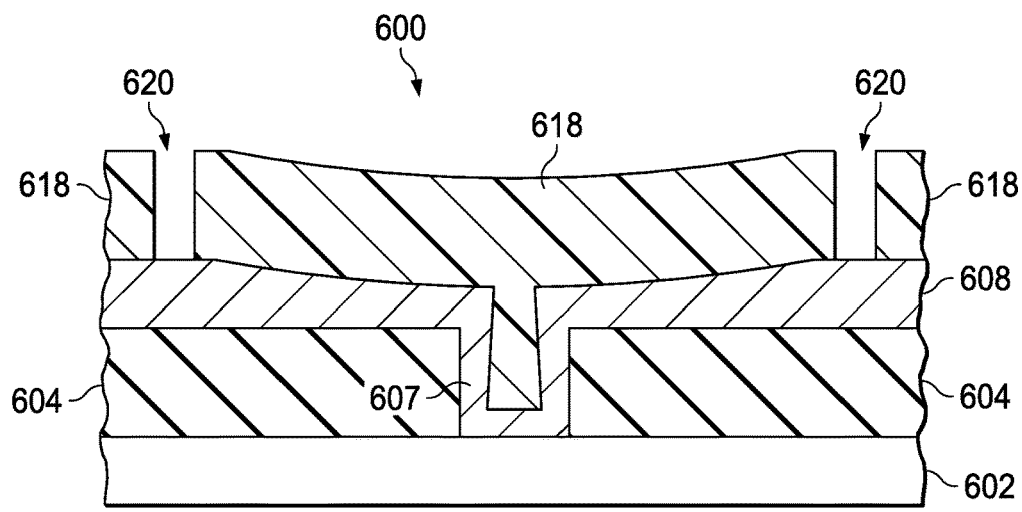
Figure 6J:
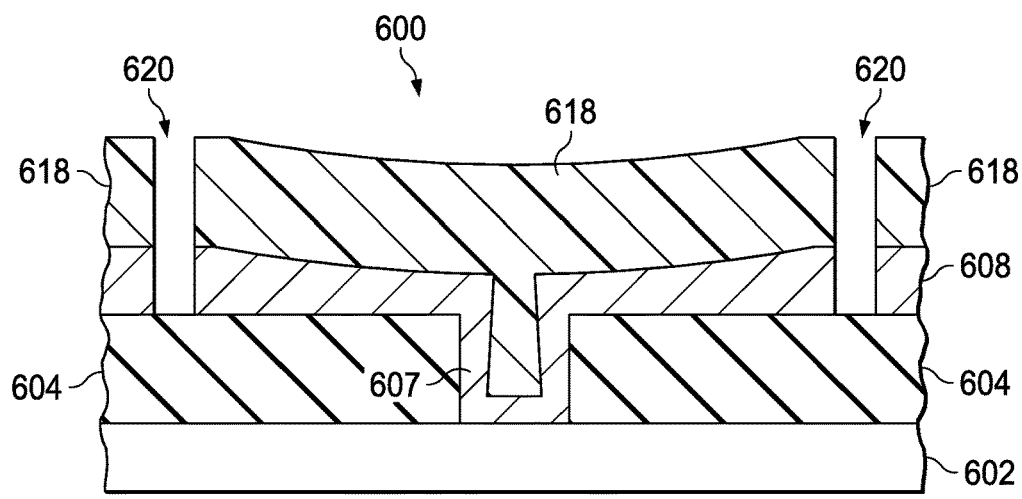
Figure 6K:
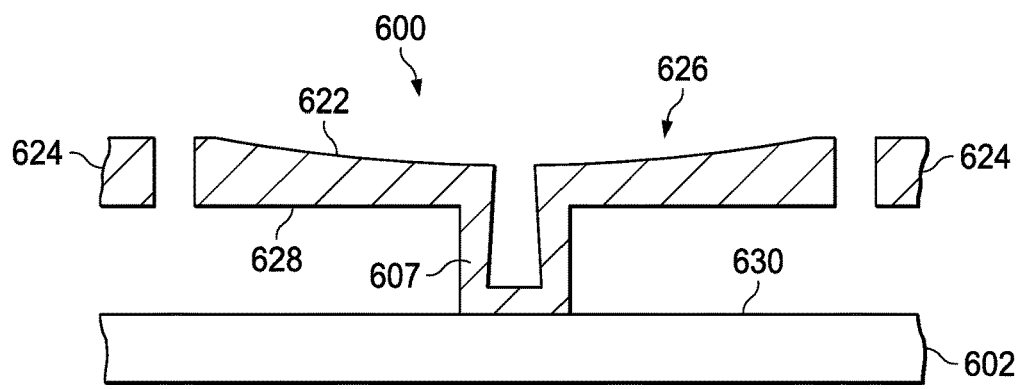

Step 516 is patterning and etching the mirror layer to create separate mirrors. As shown in FIG. 6H, second photoresist layer 618 is deposited on mirror layer 608. As shown in FIG. 6I, second photoresist layer 618 is exposed and patterned to provide openings 620. As shown in FIG. 6J, second photoresist layer 618 is used as an etch mask to etch mirror layer 608 into separate mirrors through openings 620.

FIG. 6 shows openings 620 on either side of the resulting mirror. However, openings 620 will surround the resulting mirror to allow for formation of a separate mirror 622 as shown in FIG. 6K. Step 518 is removing the sacrificial layer. As shown in FIG. 6K, selective isotropic etching removes sacrificial layer 604 to provide mirror 622 and adjacent mirrors 624. Thus, in this example, mirror 622 includes a nonplanar surface 626 and a planar surface 628 facing a substrate surface 630.

Figure 7:
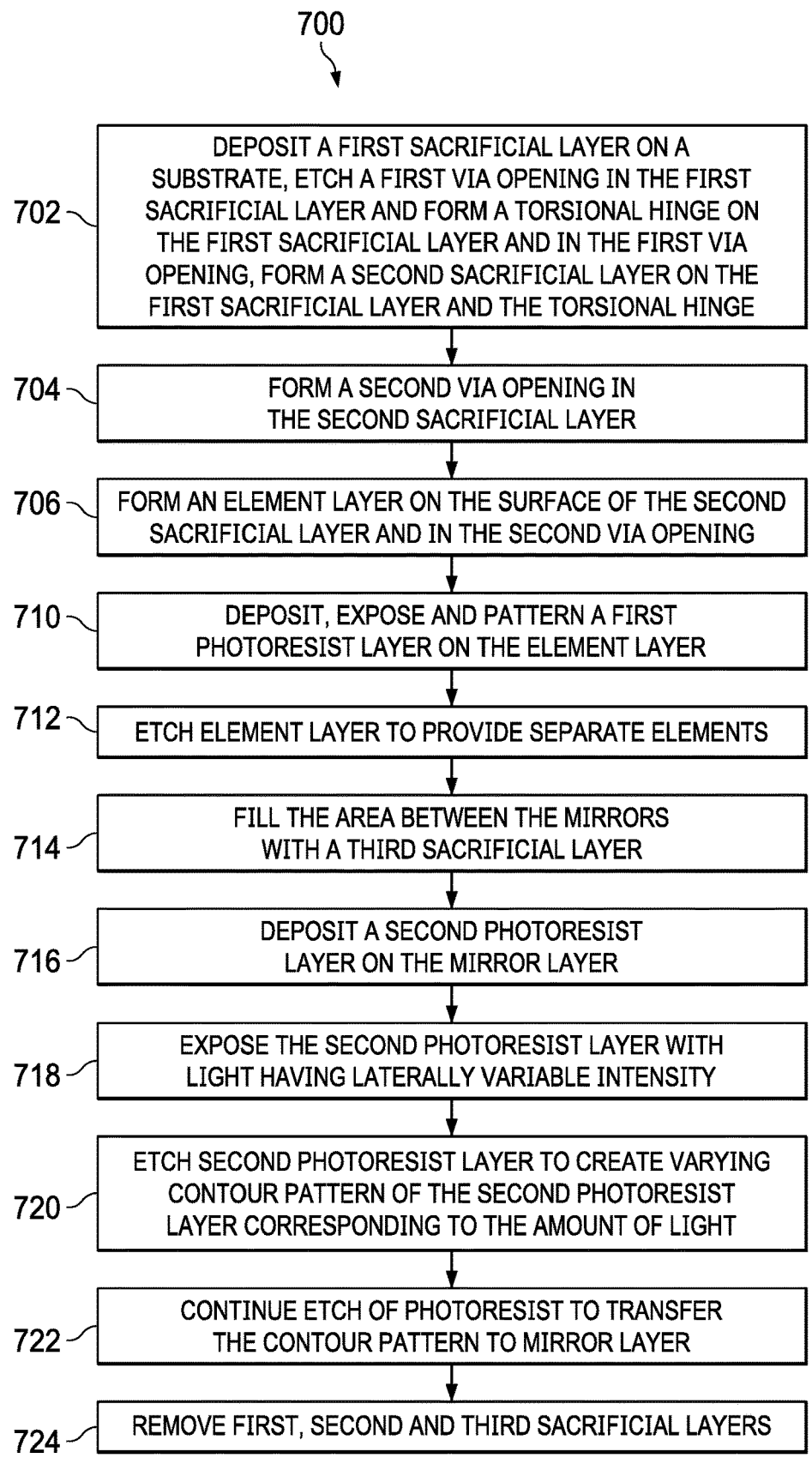
FIG. 7 is a flow diagram of an example process for forming an example apparatus, such as a micromirror.
Figure 8A:
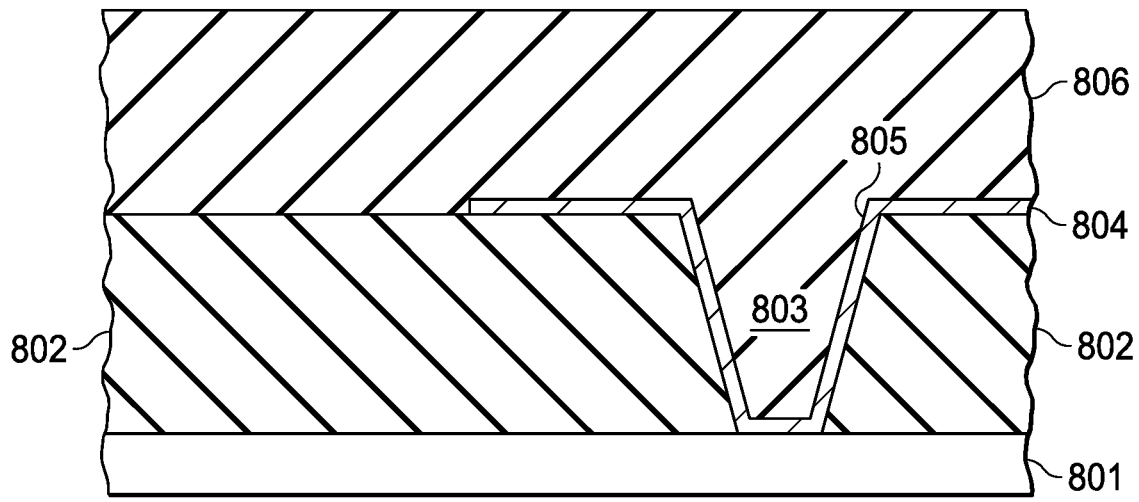
FIGS. 8A-8L (collectively "FIG. 8") are diagrams illustrating the steps of the process of FIG. 7.

FIG. 7 is a flow diagram of an example process 700 for forming an example apparatus, such as a micromirror. FIGS. 8A-8L (collectively "FIG. 8") illustrate the steps of process 700 and are described concurrently with the description of FIG. 7. Step 702 is depositing a first sacrificial layer on a substrate, etching a first via opening in the first sacrificial layer and forming a torsional hinge on the first sacrificial layer and in the first via opening, forming a second sacrificial layer on the first sacrificial layer and the torsional hinge. These steps form a torsional hinge 805 and a first sacrificial layer 802 that serves as a base or substrate for forming micromirror 800. As shown in FIG. 8A, first sacrificial layer 802 is formed on substrate 801. In this example, substrate 801 is a silicon substrate that includes circuitry (not shown) to address micromirror 800. Examples of materials for first sacrificial layer 802 include silicon dioxide, silicon nitride, photoresist, polyimide, germanium, germanium oxide, polycrystalline silicon, phosphor-silicate-glass (PSG), borophospho-silicate glass (BPSG) and spin-on-glass (SOG). The specific method used for forming first sacrificial layer 802 is dependent upon the material used. In an example, sacrificial layer 604 is SOG that is spun-on to a thickness of 5,000 Å. As part of step 702, etching first sacrificial layer 802 using a patterned mask forms first via opening 803. Deposition of a material with elastic and resilient properties, such as aluminum or titanium, forms torsion bar layer 804. Etching torsion bar layer 804 using a patterned etch mask forms torsional hinge 805 as shown in FIG. 8A. Second sacrificial layer 806 is then formed on first sacrificial layer 802 and torsional hinge 805.

Figure 8B:
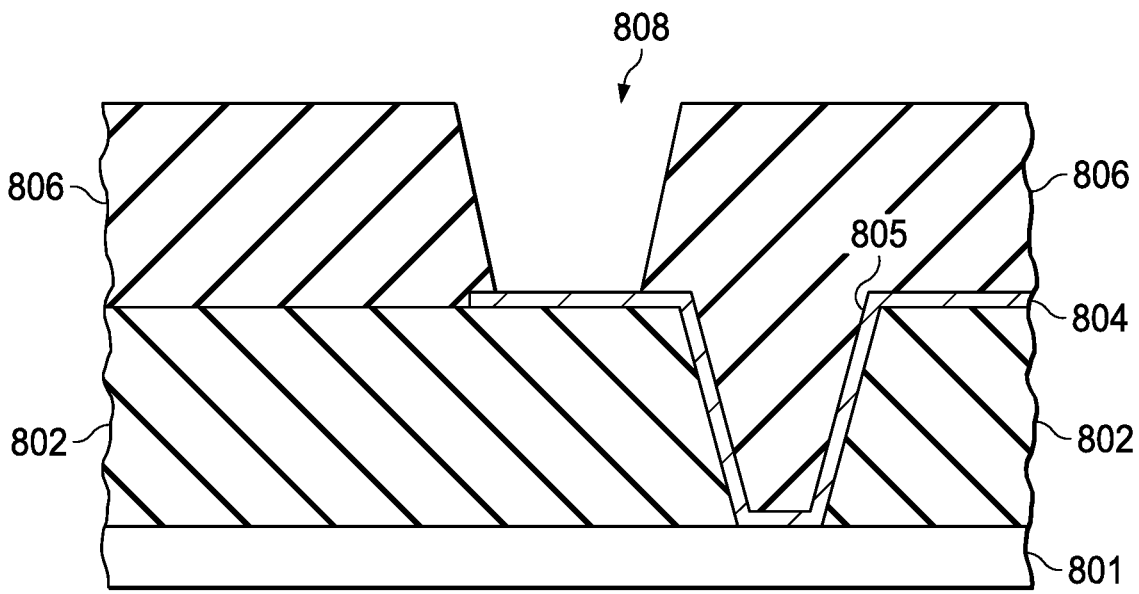
Figure 8C:
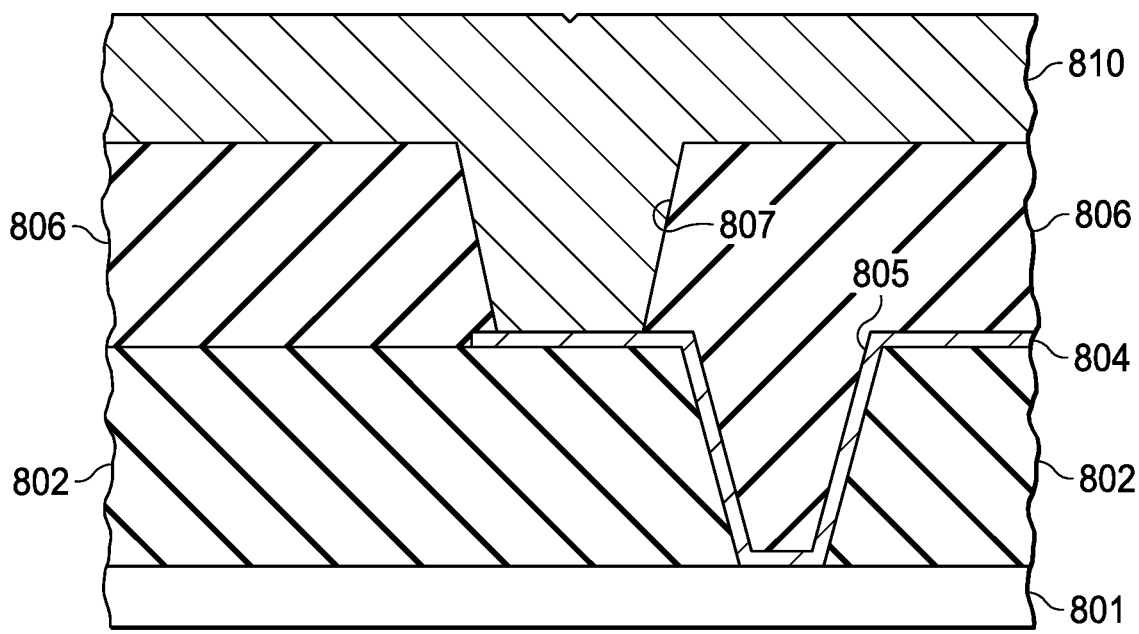

Step 704 is forming a second via opening in the second sacrificial layer. As shown in FIG. 8B, this step opens a second via opening 808 by depositing and patterning a photoresist layer (not shown) and anisotropically etching second sacrificial layer 806. Step 706 is forming an element layer on the surface of the second sacrificial layer and in the second via opening. As shown in FIG. 8C, an element layer, such as mirror layer 810, is formed by depositing a conductive layer to a thickness of 300 to 600 Å on second sacrificial layer 806 and in second via opening 808. Mirror layer 810 is a layer such as aluminum, titanium-aluminum, titanium or titanium nitride that is deposited by chemical vapor deposition (CVD) or physical vapor deposition (PVD). Thus, in this example, step 706 forms via 807 using the same material as mirror layer 810. In this example, the deposition of mirror layer 810 is thick enough to fill second via opening 808.

Figure 8D:
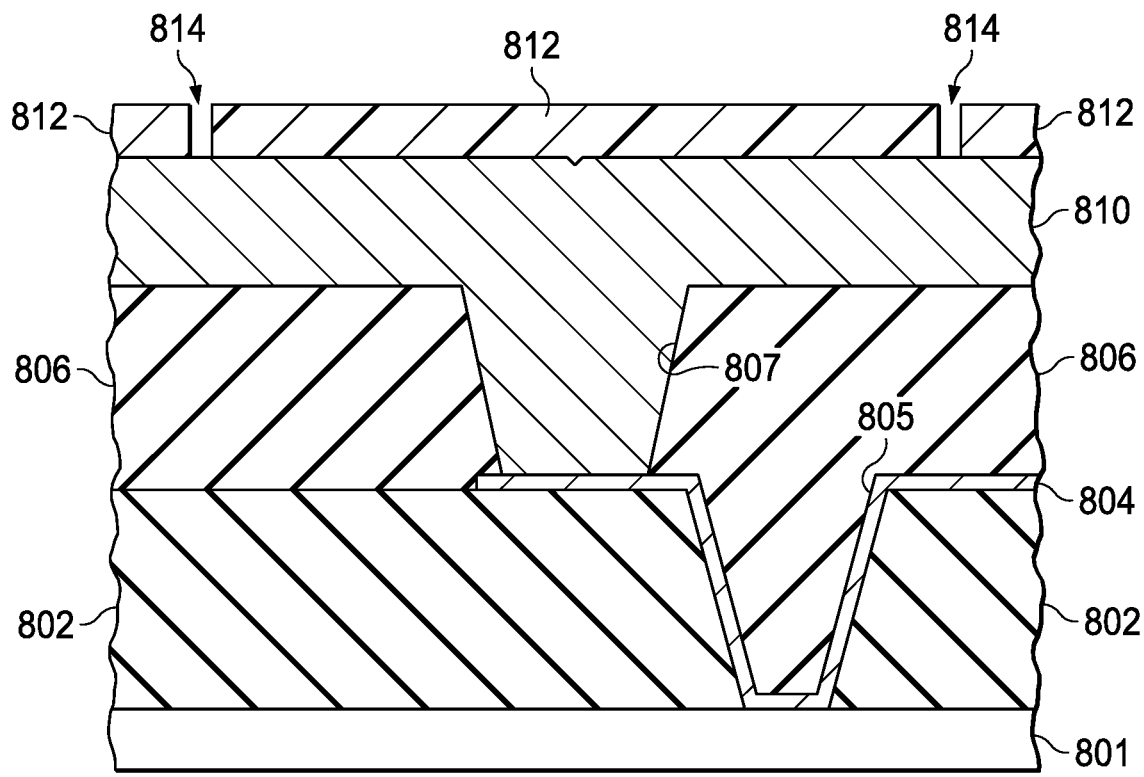
Figure 8E:
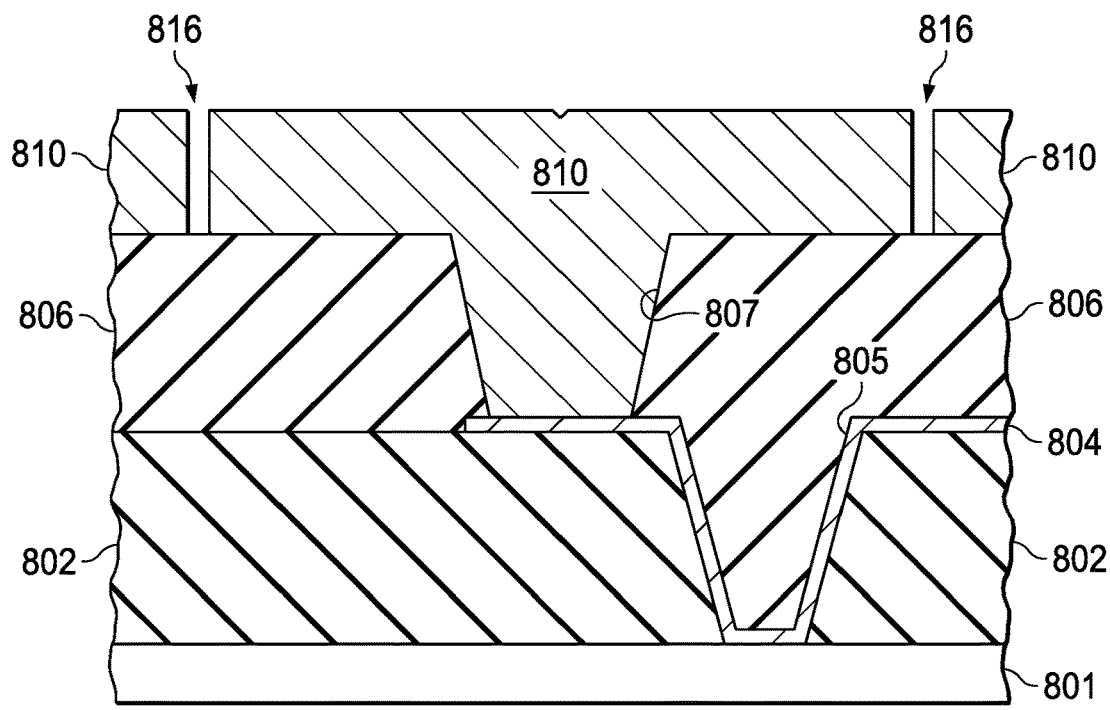
Figure 8F:
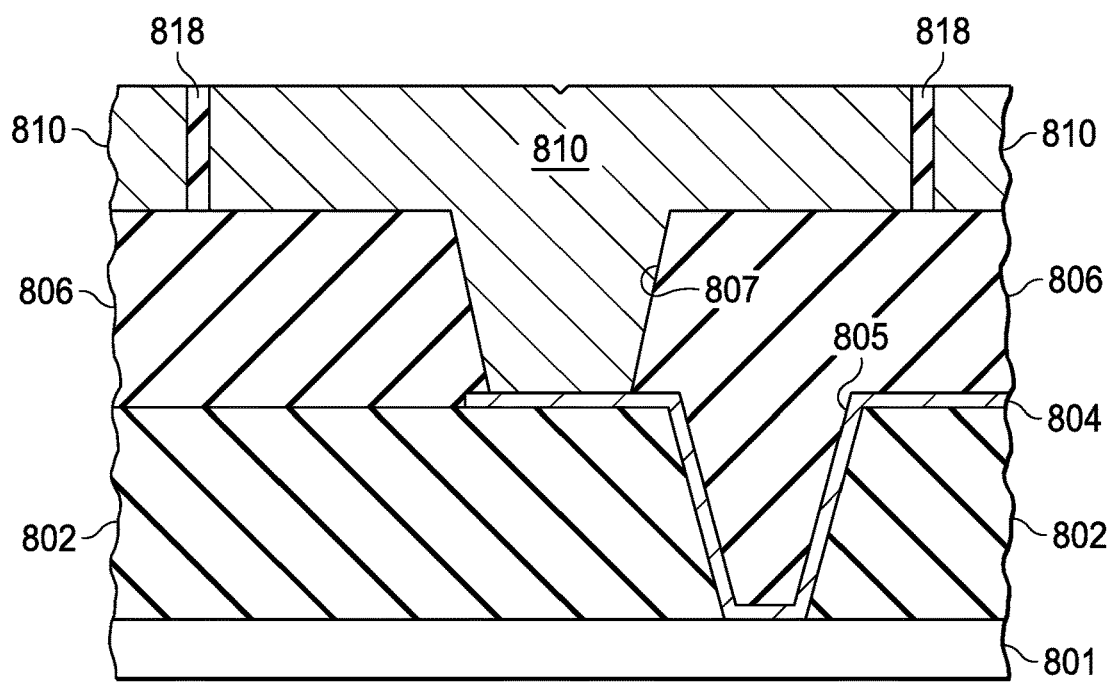

Step 710 is depositing, exposing and patterning a first photoresist layer 812. As shown in FIG. 8D, first photoresist layer 812 is deposited on mirror layer 810. Also as shown in FIG. 8D. first photoresist layer 812 is exposed and patterned to provide openings 814. Step 712 is etching the element layer to provide separate elements. As shown in FIG. 8E, first photoresist layer 812 (FIG. 8D) is an etch mask for etching mirror layer 810 into separate mirrors through openings 814 (FIG. 8D). FIG. 8 shows openings 816 on either side of the resulting mirror. However, openings 816 will surround the resulting mirror to allow for formation of a separate mirrors. Step 714 is filling the area between the mirrors with a third sacrificial layer. As shown in FIG. 8F, depositing and planarizing a third sacrificial layer, forms third sacrificial layer 818. In an example, chemical-mechanical polishing is used to remove the portion of third sacrificial layers 818 outside of openings 816 (FIG. 8E).

Figure 8G:
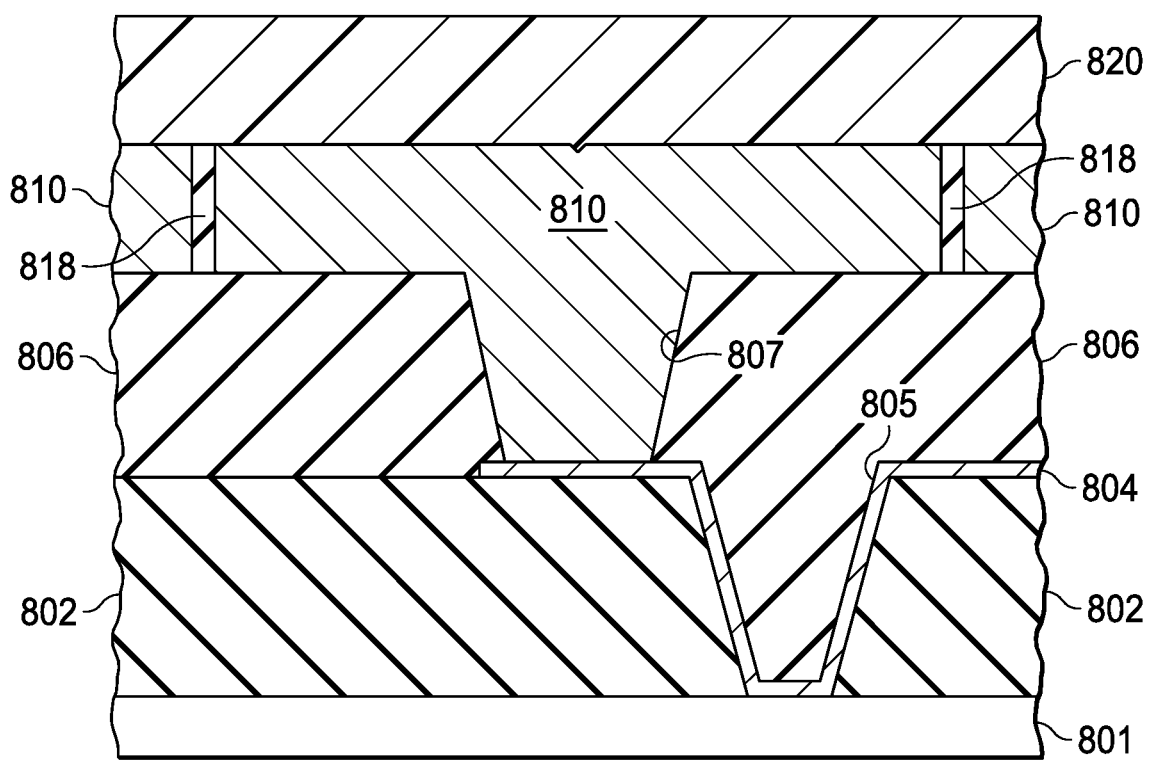
Figure 8H:
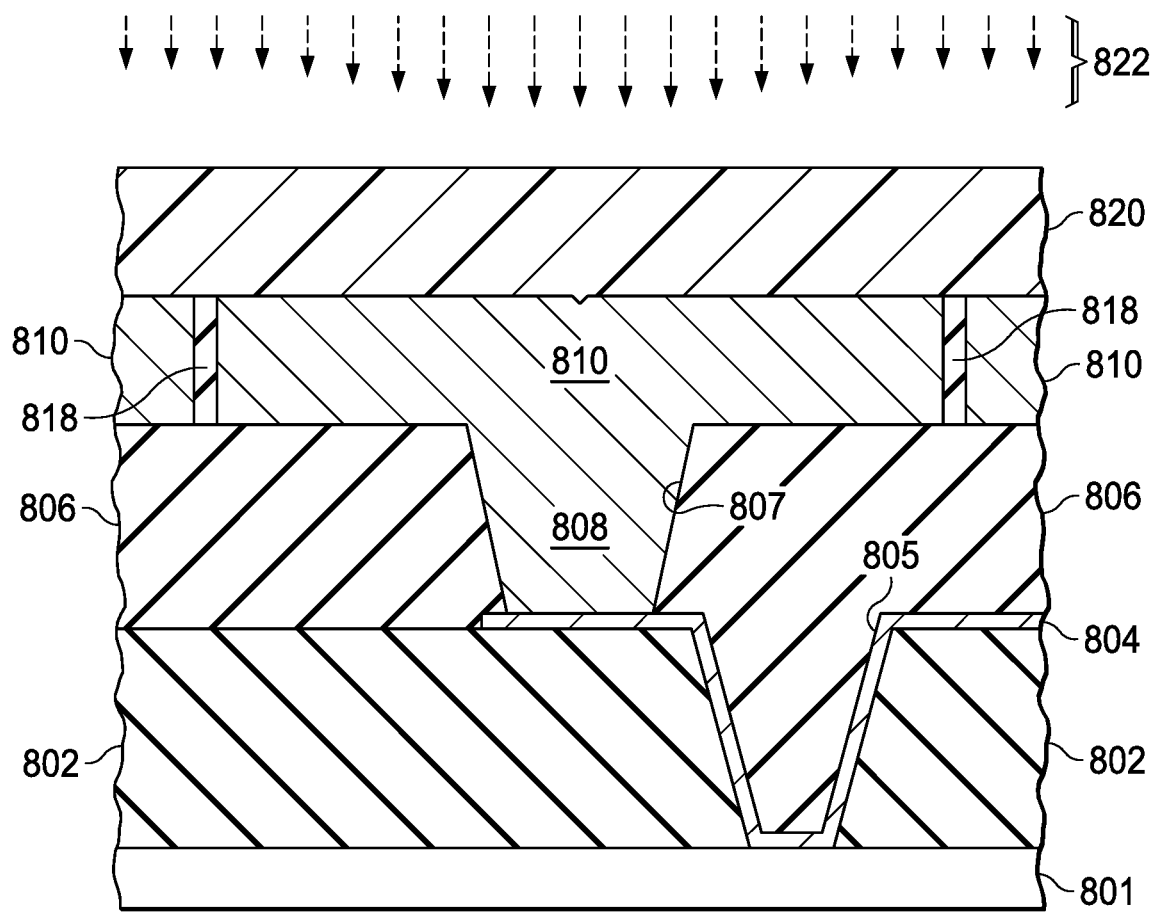
Figure 8I:
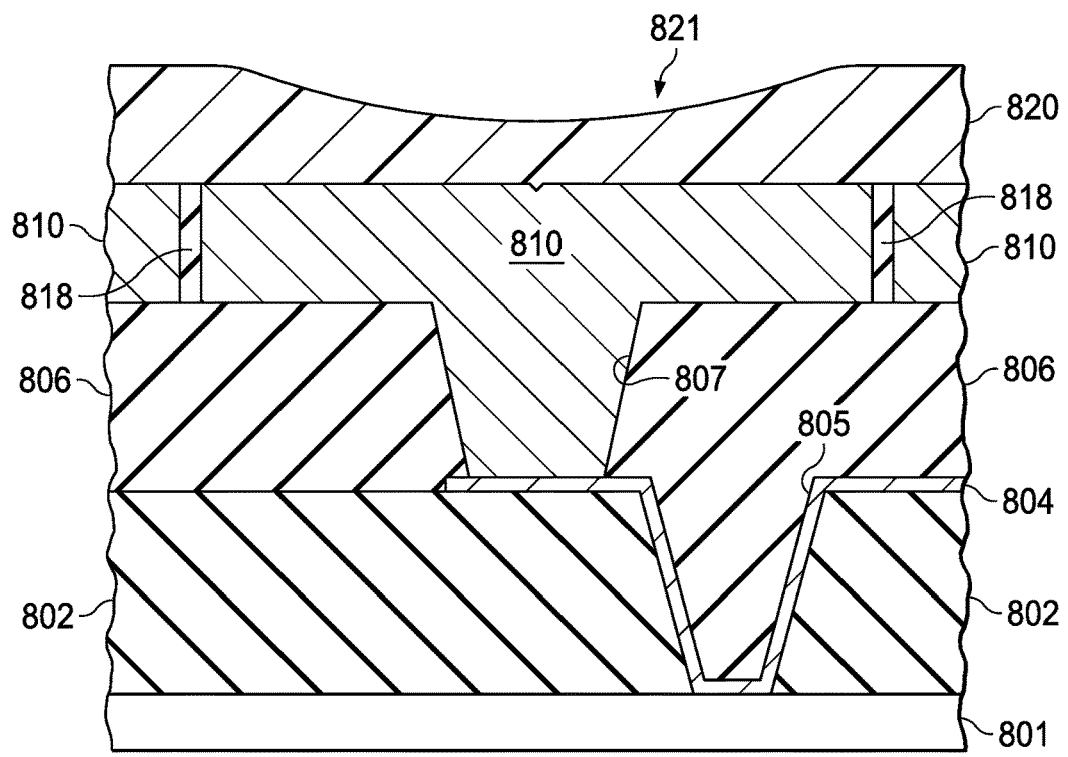

Step 716 is depositing a photoresist layer on the mirror layer. This step deposits photoresist layer 820 as shown in FIG. 8G. Step 718 is exposing the photoresist layer with laterally varying light. In the example of FIG. 8H, light 822 exposes photoresist layer 820. Light 822 has a greater intensity above second via opening 808 and gradually diminishing intensity at distances from second via opening 808. One term for this varying light is grayscale light. In an example, a grayscale mask or defocusing of a patterned mask provides varying light 822. In another example, a modulated image projects onto photoresist layer 820. Step 720 is etching the second photoresist layer to create a varying contour pattern of the second photoresist layer corresponding to the amount of light. As shown in FIG. 8I, where greater light strikes photoresist layer 820, the developer (etchant) for photoresist layer 820 removes more of photoresist layer 820. Thus, photoresist layer 820 has a varying surface contour after step 720. In an example, photoresist layer 820 is etched anisotropically using a solvent or plasma processing with selective etching to the sacrificial resist, such as chlorine and boron trichloride (Cl/BCD. In this example, this produces an indentation 821 in photoresist layer 820. In an example, after developing photoresist layer 820 with indentation 821, a second uniform light fully exposes the remaining part of photoresist layer 820 to fully polymerize photoresist layer 820 with indentation 821.

Figure 8J:
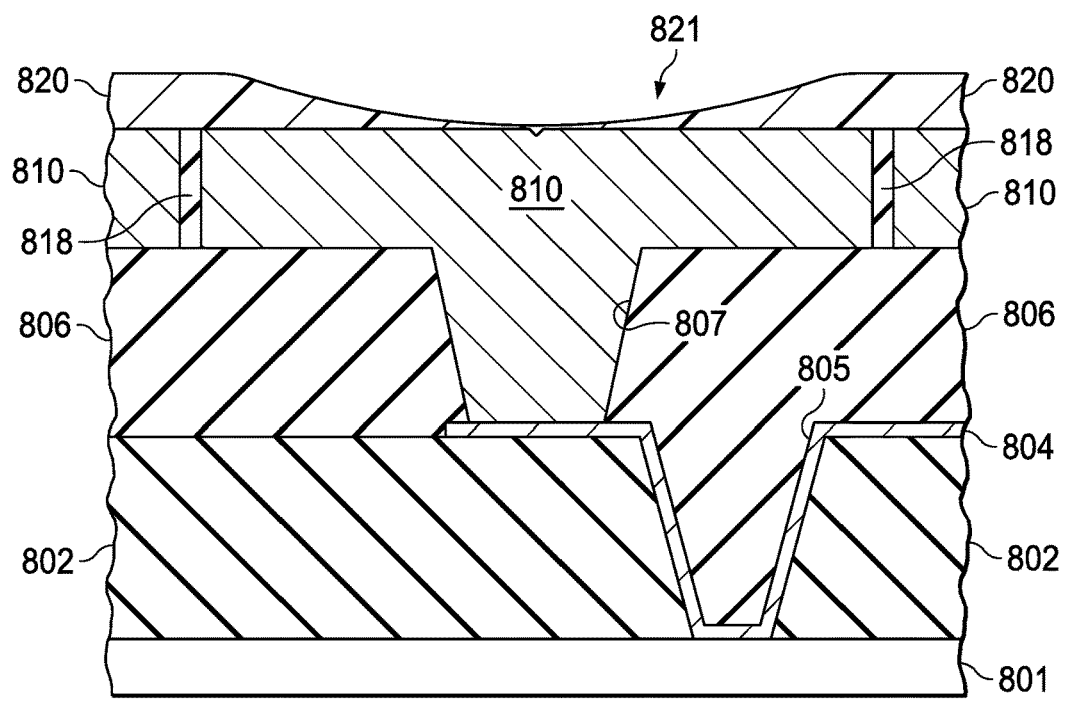
Figure 8K:
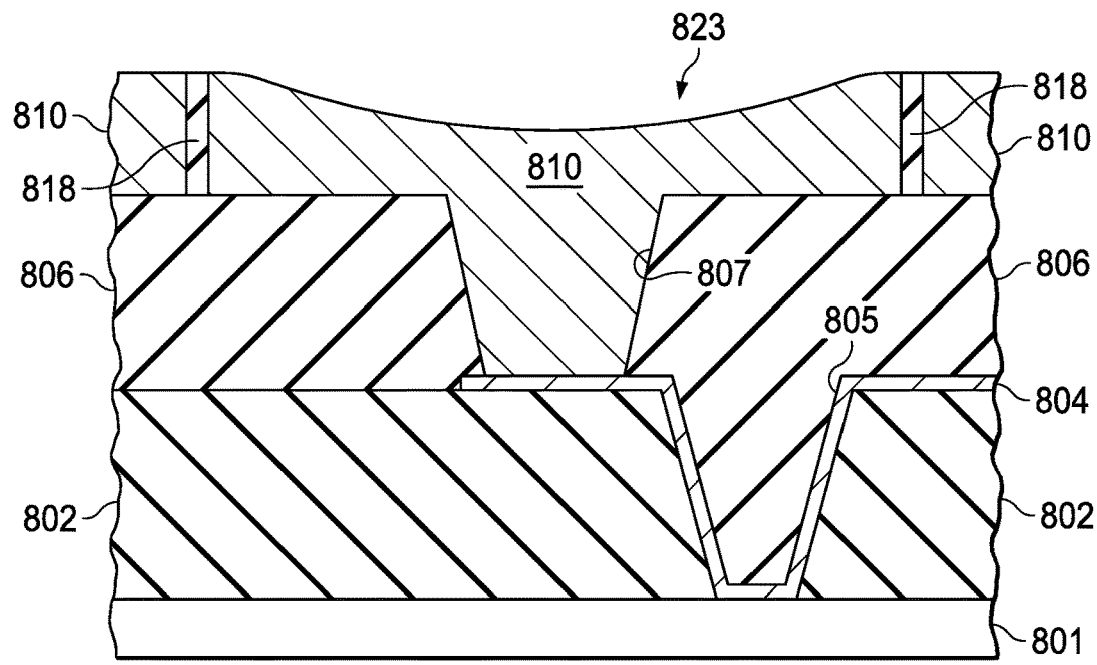

Step 722 is continuing the etch of the photoresist to transfer the thickness pattern to the mirror layer. As shown in FIG. 8J, indentation 821 partially transfers to mirror layer 810. As shown in FIG. 8K, the anisotropic etch forms indentation 823, which is a transference of indentation 821 (FIG. 8J). Thus, the surface of mirror layer 810 with indentation 821 is a nonplanar surface, while the portion of mirror layer 810 on second sacrificial layer 806 that faces substrate 801 remains a planar surface. In examples, the contour of photoresist layer 820 has a different contour than the resulting mirror layer 810. In this example, the contour of photoresist layer 820 is selected to account for the differing etching rates of photoresist layer 820 and mirror layer 810. That is, the selected contour of photoresist layer 820 is such that, after etching of photoresist layer 820 and mirror layer 810, mirror layer 810 has the desired contour.

Figure 8L:
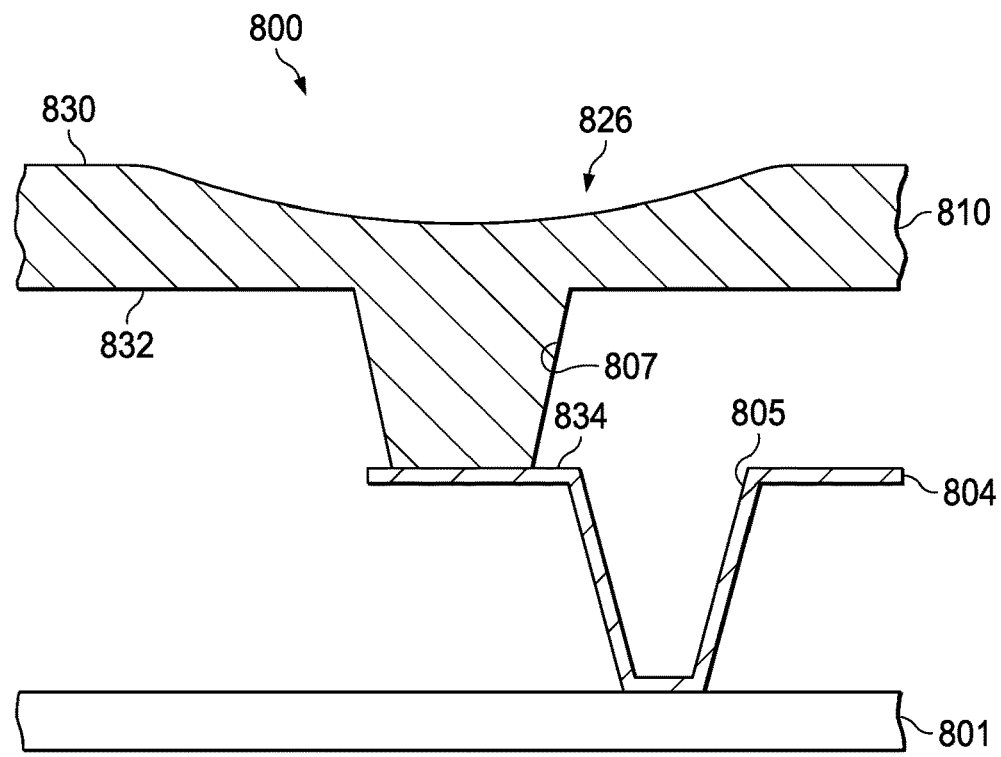

Step 724 is removing the first, second, and third sacrificial layers. As shown in FIG. 8L, step 724 removes first sacrificial layer 802, second sacrificial layer 806 and third sacrificial layer 818 (FIG. 8K). The remaining portion of mirror layer 810 forms mirror 826. The remaining portion of torsion bar layer 804 forms torsional hinge 805. Thus, in this example, mirror 826 includes a nonplanar surface 830 and a planar surface 832 facing a torsional hinge surface 834 where torsional hinge 805 serves as a substrate for mirror 826.

Modifications are possible in the described examples, and other examples are possible, within the scope of the claims.

What is claimed is:

1. An apparatus comprising:
    a substrate having a substrate surface and an electrode;
    a mirror element having: (a) a first surface proximate the electrode; and (b) a second surface opposite the first surface, the second surface including a curved reflective surface having a first edge and a second edge, in which a thickness of the mirror element decreases from the first edge to the second edge, and the mirror element is configured to tilt relative to the substrate surface responsive to a potential applied to the electrode; and
a structure coupled between the second edge and the substrate surface, in which the structure supports the mirror element.

2. The apparatus of claim 1, wherein the curved reflective surface includes a concave reflective surface.

3. The apparatus of claim 1, wherein the first surface faces the electrode.

4. An apparatus comprising:
a substrate having a substrate surface, a first electrode, and a second electrode;
a first mirror element having: (a) a first surface proximate the first electrode; and (b) a second surface opposite the first surface, the second surface including a first curved reflective surface having a first edge and a second edge, in which a thickness of the first mirror element decreases from the first edge to the second edge, and the first mirror element is configured to tilt relative to the substrate surface responsive to a first potential applied to the first electrode;
a first structure coupled between the second edge and the substrate surface, in which the first structure supports the first mirror element;
a second mirror element proximate the first mirror element, the second mirror element having: (a) a third surface proximate the second electrode; and (b) a fourth surface opposite the third surface, the fourth surface including a second curved reflective surface having a third edge and a fourth edge, in which a thickness of the second mirror element decreases from the third edge to the fourth edge, and the second mirror element is configured to tilt relative to the substrate surface responsive to a second potential applied to the second electrode; and
a second structure coupled between the fourth edge and the substrate surface, in which the second structure supports the second mirror element.

5. The apparatus of claim 4, wherein:
the first mirror element is configured to, responsive to the first potential applied to the first electrode, direct light to a first portion of an area by tilting at an angle relative to the substrate surface;
the second mirror element is configured to, responsive to the second potential applied to the second electrode, direct light to a second portion of the area by tilting at the angle relative to the substrate surface; and
the first and second portions are separated by a first distance between them.

6. An apparatus comprising:
a substrate having a substrate surface and an electrode;
a mirror element having: (a) a first surface proximate the electrode; and (b) a second surface opposite the first surface, the second surface including a reflective surface, and the mirror element is configured to:
responsive to a first potential applied to the electrode, direct light to a first portion of an area by tilting at a first angle relative to the substrate surface; and
responsive to a second potential applied to the electrode, direct light to a second portion of the area by tilting at a second angle relative to the substrate surface, in which a corner of the second portion overlaps a corner of the first portion, and less than a quarter of the second portion overlaps the first portion; and a structure coupled between the mirror element and the substrate surface, in which the structure supports the mirror element.

7. The apparatus of claim 6, wherein a single corner of the second portion overlaps a single corner of the first portion.

8. The apparatus of claim 6, wherein two corners of the second portion overlap the first portion.

9. The apparatus of claim 6, wherein the second surface includes a curved reflective surface having a first edge and a second edge, a thickness of the mirror element decreasing from the first edge to the second edge; and
wherein the structure is coupled between the second edge and the substrate surface.

10. The apparatus of claim 9, wherein the curved reflective surface comprises a concave reflective surface.

11. The apparatus of claim 6, wherein the first surface comprises a planar surface.

12. The apparatus of claim 1, wherein the first surface includes a planar surface.

13. The apparatus of claim 1, wherein the electrode is configured to generate an electrostatic force responsive to the potential, and the mirror element is configured to tilt relative to the substrate surface responsive to the electrostatic force.

14. The apparatus of claim 1, wherein the mirror element and the structure are formed of a material, the structure being contiguous with the mirror element.

15. The apparatus of claim 1, wherein:
the electrode is a first electrode;
the mirror element is a first mirror element;
the structure is a first structure;
the curved reflective surface is a first curved reflective surface;
the potential is a first potential; and
the apparatus includes:
a second electrode;
a second mirror element having: (a) a third surface proximate the second electrode; and (b) a fourth surface opposite the third surface, the fourth surface including a second curved reflective surface having a third edge and a fourth edge, in which a thickness of the second mirror element decreases from the third edge to the fourth edge, and the second mirror element is configured to tilt relative to the substrate surface responsive to a second potential applied to the second electrode; and
a second structure coupled between the fourth edge and the substrate surface, in which the second structure supports the second mirror element.

16. The apparatus of claim 15, further comprising a third structure on the substrate surface and coupled between the first and second structures.

17. The apparatus of claim 16, wherein the first and second mirror elements and the first, second, and third structures are formed of a material and are contiguous.

18. The apparatus of claim 1, further comprising a torsional hinge on the substrate,
wherein the structure is coupled between the second edge and the torsional hinge.

19. The apparatus of claim 1, wherein:
the structure is a first structure; and
the apparatus further comprises:
a plate element having a third surface coupled to the first structure; and a second structure coupled between the plate element and the substrate surface, in which the second structure supports the plate element and the mirror element.

20. The apparatus of claim 1 wherein the mirror element is made of a metallic material.

21. The apparatus of claim 20, wherein the metallic material includes at least one of:
aluminum, titanium-aluminum, titanium or titanium nitride.

22. The apparatus of claim 1, wherein the potential is a first potential, and the mirror element is configured to:
responsive to the first potential applied to the electrode, direct light to a first portion of an area by tilting at a first angle relative to the substrate surface; and
responsive to a second potential applied to the electrode, direct light to a second portion of the area by tilting at a second angle relative to the substrate surface; and
wherein a corner of the second portion overlaps a corner of the first portion, and less than a quarter of the second portion overlaps the first portion.

23. The apparatus of claim 22, wherein a single corner of the second portion overlaps a single corner of the first portion.

24. The apparatus of claim 22, wherein two corners of the second portion overlap the first portion.

25. The apparatus of claim 5, wherein the first mirror element is adjacent the second mirror element within an array of mirror elements, and the first and second curved reflective surfaces are separated by a second distance between them.

26. The apparatus of claim 4, wherein:
the first mirror element is configured to:
responsive to the first potential applied to the first electrode, direct light to a first portion of an area by tilting at a first angle relative to the substrate surface; and
responsive to a third potential applied to the first electrode, direct light to a second portion of the area by tilting at a second angle relative to the substrate surface, in which a corner of the second portion overlaps a corner of the first portion, and less than a quarter of the second portion overlaps the first portion; and
the second mirror element is configured to:
responsive to the second potential applied to the second electrode, direct light to a third portion of the area by tilting at a third angle relative to the substrate surface; and
responsive to a fourth potential applied to the second electrode, direct light to a fourth portion of the area by tilting at a fourth angle relative to the substrate surface, in which a corner of the fourth portion overlaps a corner of the third portion, and less than a quarter of the fourth portion overlaps the third portion.

27. The apparatus of claim 26, wherein a single corner of the second portion overlaps a single corner of the first portion, and a single corner of the fourth portion overlaps a single corner of the third portion.

28. The apparatus of claim 26, wherein two corners of the second portion overlap the first portion, and two corners of the fourth portion overlap the third portion.

29. The apparatus of claim 26, wherein two corners of the second portion overlap a single corner of the first portion and a single corner of the third portion.

* * * * *